(12) United States Patent
Katou et al.

(10) Patent No.: US 9,887,003 B2
(45) Date of Patent: Feb. 6, 2018

(54) SEMICONDUCTOR STORAGE DEVICE

(71) Applicant: Panasonic Intellectual Property Management Co., Ltd., Osaka (JP)

(72) Inventors: Junichi Katou, Kyoto (JP); Hiroyasu Nagai, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/346,639

(22) Filed: Nov. 8, 2016

(65) Prior Publication Data

US 2017/0053697 A1 Feb. 23, 2017

Related U.S. Application Data

(63) Continuation of application No. PCT/JP2015/002607, filed on May 25, 2015.

(30) Foreign Application Priority Data

May 26, 2014 (JP) ................................. 2014-107748

(51) Int. Cl.
*G11C 11/00* (2006.01)
*G11C 13/00* (2006.01)
*H01L 23/528* (2006.01)
*H01L 27/02* (2006.01)
(Continued)

(52) U.S. Cl.
CPC .......... *G11C 13/004* (2013.01); *G11C 13/003* (2013.01); *G11C 13/0069* (2013.01); *H01L 23/528* (2013.01); *H01L 27/0207* (2013.01); *H01L 27/2436* (2013.01); *H01L 27/2463* (2013.01); *H01L 27/2481* (2013.01); *H01L 45/04* (2013.01); *G11C 2213/79* (2013.01)

(58) Field of Classification Search
USPC .................................... 365/148, 158, 230.03
See application file for complete search history.

(56) References Cited

U.S. PATENT DOCUMENTS 5,726,929 A    3/1998  Suminaga et al.
9,478,273 B2 * 10/2016  Dray ................... G11C 11/1675
2009/0273961 A1  11/2009  Ono et al.
(Continued)

FOREIGN PATENT DOCUMENTS

JP         9-259594      10/1997
JP         2009-271985   11/2009
(Continued)

OTHER PUBLICATIONS

International Search Report of PCT application No. PCT/JP2015/002607 dated Jun. 23, 2015.

*Primary Examiner* — Vu Le
(74) *Attorney, Agent, or Firm* — McDermott Will & Emery LLP

(57) ABSTRACT

A semiconductor memory solves performance degradation of a memory device caused by performance of memory functions different depending on a position of a memory cell array. In the memory cell array including memory cells in each of which a memory element is electrically connected to one of a source and a drain of a cell transistor, the cell transistor includes at least two types with different current driving capability according to a position in the memory cell array.

6 Claims, 6 Drawing Sheets

(51) Int. Cl.
   *H01L 27/24*   (2006.01)
   *H01L 45/00*   (2006.01)

(56) References Cited

U.S. PATENT DOCUMENTS

| | | |
|---|---|---|
| 2010/0177555 A1 | 7/2010 | Shimakawa et al. |
| 2011/0032745 A1 | 2/2011 | Ichihara et al. |
| 2011/0164444 A1* | 7/2011 | Fukano ............ G11C 13/0002 365/51 |
| 2014/0032812 A1* | 1/2014 | Ong .................... G11C 7/222 711/102 |
| 2014/0112055 A1* | 4/2014 | Kawahara ............ G11C 13/00 365/148 |

FOREIGN PATENT DOCUMENTS

| | | |
|---|---|---|
| JP | 2011-040112 | 2/2011 |
| JP | 2011-142186 | 7/2011 |
| JP | 2012-182493 | 9/2012 |
| WO | 2013/080511 | 6/2013 |

* cited by examiner

SEMICONDUCTOR STORAGE DEVICE

BACKGROUND

1. Technical Field

The present disclosure relates to semiconductor memories, and to a technology to solve performance degradation of a memory device caused by different performance of memory functions depending on a position of a memory cell.

2. Description of the Related Art

Semiconductor memories are used for devices such as embedded devices, computers, and information and communications devices. In recent years, technologies to implement large capacity, small size, high-speed rewriting, high-speed reading, and low power consumption operations have been intensively developed.

In particular, a Resistive Random Access Memory (ReRAM) that uses a resistance change element for a storage element has a feature of high-speed, low-power-consumption rewriting capability as compared with conventional flash memories.

The resistance change element refers to an element having a property in which resistance reversibly changes in response to an electrical signal, and having capability of nonvolatily storing data corresponding to this resistance.

As a nonvolatile semiconductor storage device using the resistance change element, a generally known nonvolatile semiconductor storage device includes an array of memory cells, called so-called 1T1R type, arranged in a matrix at positions of intersection points of bit lines, word lines, and source lines which are orthogonally arranged, each of the memory cells being formed by connecting the resistance change element with a metal oxide semiconductor (MOS) transistor in series.

PTL 1 describes a nonvolatile semiconductor storage device including 1T1R type memory cells.

FIG. 1 is an equivalent circuit diagram of the memory cell described in PTL 1.

In FIG. 1, resistance change element 101 is electrically connected to cell transistor 102 including an N-channel metal oxide semiconductor (NMOS) transistor.

Information stored in the memory cell is recorded as magnitude of resistance of resistance change element 101.

For example, the stored information is read by applying 0 V to source terminal 103, by applying a positive voltage to gate terminal 104, by applying a positive voltage to bit terminal 106, by applying 0 V to ground terminal 107, and by detecting magnitude of a current value that flows from bit terminal 106 to source terminal 103.

Rewriting of information is performed as follows.

An operation to change resistance change element 101 from a state where the resistance is high (a high resistance state) to a state where the resistance is low (a low resistance state) is as follows.

A voltage of 0 V is applied to bit terminal 106 and ground terminal 107, a positive voltage is applied to gate terminal 104, and positive voltage pulses are applied to source terminal 103. This operation causes resistance change element 101 to transition from the high resistance state to the low resistance state.

An operation to change resistance change element 101 from the low resistance state to the high resistance state is as follows.

A voltage of 0 V is applied to source terminal 103 and ground terminal 107, a positive voltage is applied to gate terminal 104, and positive voltage pulses are applied to bit terminal 106. This operation causes resistance change element 101 to transition from the low resistance state to the high resistance state.

FIG. 2 is a diagram illustrating a change in a potential difference across the resistance change element and in a source-drain potential difference of the cell transistor over time, when the memory cell using the resistance change element described in PTL 1 transitions from the high resistance state to the low resistance state. FIG. 3 is a diagram illustrating a relationship between a voltage and a current of the resistance change element and the cell transistor, when the memory cell using the resistance change element described in PTL 1 transitions from the high resistance state to the low resistance state. With reference to FIG. 2 and FIG. 3, a detailed description will be given about the change in the voltage and the current of resistance change element 101 and cell transistor 102 when resistance change element 101 is changed from the high resistance state to the low resistance state.

In FIG. 2, reference numeral 202 illustrates the change in the potential difference across resistance change element 101 over time, and reference numeral 201 illustrates the change in the source-drain potential difference of cell transistor 102 over time, when positive voltage V1 is applied to bit terminal 106 in the high resistance state. Immediately after positive voltage V1 is applied to bit terminal 106, the potential difference applied across resistance change element 101 is VH, and the source-drain potential difference of cell transistor 102 is V1−VH.

From this state, the resistance of resistance change element 101 starts to change at time T1 at which the transition starts, and then resistance change element 101 transitions to the low resistance state at time T2. After the transition to the low resistance state, the potential difference applied across resistance change element 101 becomes VL, and the source-drain potential difference of cell transistor 102 becomes V1−VL. At this time, VL<VH.

FIG. 3 illustrates the change in the current value when resistance change element 101 transitions from the high resistance state to the low resistance state. Reference numeral 301 illustrates a relationship between the source-drain voltage (horizontal axis) and the current that flows between the source and drain (vertical axis) of cell transistor 102 when the voltage at the gate terminal of cell transistor 102 is V1−VH. When resistance change element 101 is in the high resistance state, the source-drain voltage difference is V1−VH, and thus the current that flows between the source and drain is the current value at point 303 on line 301. Reference numeral 302 illustrates a relationship between the source-drain voltage and the current that flows between the source and drain of cell transistor 102 when the voltage at the gate terminal is V1−VL. After the transition to the low resistance state, the source-drain voltage difference is V1−VL, and thus the current that flows between the source and drain is the current value at point 304 on line 302.

PTL 2 describes a technology to prevent degradation in performance of a memory device caused by performance of memory functions different depending on a position of a memory cell array.

FIG. 4 illustrates a structure described in PTL 2. FIG. 4 illustrates a stacked layer structure stacked on a semiconductor substrate in order of a first conductive line, a first variable resistance element, a second conductive line, a second variable resistance element, . . . , an n-th conductive line, an n-th variable resistance element, and a (n+1)-th conductive line, where n is a natural number equal to or larger than 2. The stacked layer structure further includes a first to a (n+1)-th drivers Dr1(1), Dr2(1) that drive the first to (n+1)-th conductive lines L1(1), L2(1), . . . , L(n+1)(1). Sizes of the first to (n+1)-th drivers Dr1(1), Dr2(1) become gradually larger from the first driver to the (n+1)-th driver.

When a plurality of memory cell arrays are stacked, a time constant of a via plug for connecting a conductive line in each of the memory cell arrays and the driver for driving the conductive line differs from one memory cell array to another. However, by minimizing increase in a region in which the drivers are formed with the above-described structure for increase in a number of memory cell arrays to be stacked, an advantage of large capacity due to three-dimension of the memory cell arrays can be obtained.

PTL 3 provides, in a bank scheme ROM, a technology to reduce variations in bit line potential caused by a difference in a position within a bank of a selected memory cell, and to achieve increase in margin of reading. The ROM of PTL 3 includes: a memory cell array including memory cells arranged in a matrix, each of the memory cells including a memory transistor; first and second main bit lines which are each provided with predetermined potential for reading information from the selected memory cell; and a plurality of first and second sub bit lines which are provided for each column of the memory cells and serve as a common source and a common drain of the memory transistor that constitutes the memory cell. Moreover, the ROM includes: a plurality of word lines provided for each row of the memory cells, each of the word lines being connected to gates of the memory transistors forming the memory cells; a first bank selection transistor connected between the first sub bit line and the first main bit line for selecting the memory cell column; and a second bank selection transistor connected between the second sub bit line and the second main bit line for selecting the memory cell column. Moreover, the ROM includes bank selection lines provided for each of the bank selection transistors and connected to each gate. Potential according to a position of the selected word line in the memory cell array is applied to each bank selection line as on potential of the bank selection transistor.

CITATION LIST

Patent Literature

PTL 1: Unexamined Japanese Patent Publication No. 2012-182493
PTL 2: Unexamined Japanese Patent Publication No. 2011-142186
PTL 3: Unexamined Japanese Patent Publication No. 1109-259594

SUMMARY

In a semiconductor memory, performance of memory functions may differ depending on a position of a memory cell array. A phenomenon in which the difference in performance depending on the position of a 1T1R type ReRAM memory cell array arises will be described with reference to FIG. 5.

FIG. 5 is a structure diagram which cuts out part of a 1T1R type ReRAM memory cell array. Bit line 503 is connected to bit line driver 501, and source line 504 is connected to source line driver 502. Between bit line 503 and source line 504 are connected a plurality of memory cells in each of which a cell transistor and a resistance change element are connected in series. The connected N+1 memory cells are WL_0, WL_1, and . . . WL_N in increasing order of distance from each driver. When the X-th memory cell is WL_X and this memory cell is changed to a low resistance state, the cell transistor of WL_X is set to an on state, the cell transistors other than WL_X are set to an off state, 0 V is applied to bit line 503, and positive voltage pulses are applied to source line 504. At this time, a current flows from source line driver 502 to bit line driver 501 through path 507.

When output voltages of the drivers are constant, the voltage applied to the memory cell changes depending on the position of the memory cell. This is because source line 504 and bit line 503, which are the path through which the current flows, have resistance, and the resistance increases as the path is longer. Therefore, a voltage drop occurs in the voltage that is output from source line driver 502 due to source line 504. As a result, a large potential difference is applied across the memory cell close to each driver, while a small potential difference is applied across the memory cell far from each driver.

FIG. 6 is a diagram illustrating a difference in the current that flows through the memory cell with a long electric connection path from each driver and the memory cell with a short electric connection path from each driver at each resistance lowering completion point. Reference numeral 601 represents a relationship between a source-drain potential difference and a current value that flows between the source and drain of cell transistor 102 of the memory cell close to each driver. In line 601, a gate voltage is V1−VL1. Resistance lowering completion point 603 represents the source-drain potential difference and the current value that flows through the memory cell when the lowering of resistance is completed. Reference numeral 605 is a straight line that connects resistance lowering completion point 603 and a point of voltage V1 and current 0. An inclination of line 605 represents magnitude of resistance of resistance change element 101, and the resistance of resistance change element 101 is smaller as the inclination of line 605 is larger.

Reference numeral 602 represents a relationship between the source-drain potential difference and the current value that flows between the source and drain of cell transistor 102 of the memory cell far from each driver.

It is assumed that the voltage drop caused by a resistance component of source line 504 is d (d is a positive value) while the current flows from source line driver 502 and reaches the memory cell. At this time, V1−d is applied to source terminal 103 of the memory cell, 0V is applied to bit terminal 106, and Vg is applied to gate terminal 104 of the cell transistor. When the voltage drop caused by resistance change element 101 at the resistance lowering completion point is VL1, terminal 105 on a bit line side of cell transistor 102 becomes V1−d−VL1, and driving capability of the cell transistor becomes equivalent to driving capability in a state where the gate voltage decreases by d. Reference numeral 602 represents a relationship between the current value and the source-drain potential difference on an assumption of a state where the driving capability of the cell transistor decreases. The resistance lowering completion point becomes point 604, and the current value becomes smaller than at resistance lowering completion point 603 that assumes the memory cell close to each driver. This is mainly because the long connection path from each driver brings about the voltage drop caused by the resistance component of source line 504, resulting in decrease in the driving capability of the cell transistor.

Attention is paid to the resistance of resistance change element 101 at the resistance lowering completion point. Reference numeral 606 is a straight line that connects resistance lowering completion point 604 and a point of voltage V1-d and current 0. The inclination of line 605 represents magnitude of resistance of resistance change element 101. When the memory cell is positioned far from each driver, as represented by resistance lowering completion point 604, the resistance lowering completion point goes down as compared with resistance lowering completion point 603, and thus the inclination of line 606 that represents the magnitude of the resistance is gentle, that is, represents that the resistance is large.

The large resistance after the lowering of resistance affects reliability. During reading, an operation is performed to read information recorded by magnitude of the current that flows through the memory cell. The reading is usually performed by comparison of the current value with a reference current value to determine a magnitude relationship between the current values. It is necessary to secure sufficiently large current as compared with the reference current when the resistance is lowered. The large resistance leads to the small current value, disabling a current difference from the reference current to be secured. This results in that the memory cell can endure neither variations between circuits nor decrease in the current caused by degradation over time.

In PTL 2, a driver size is increased as the time constant of the via plug increases. In PTL 3, on resistance of bank Tr is changed by changing potential (gate potential) of the bank selection line, and a current characteristic of the memory cell after the lowering of resistance cannot be changed.

In a memory cell array including memory cells in each of which a memory element is electrically connected to one of a source and drain of a cell transistor, a method for solving performance degradation of a memory device caused by performance of memory functions being different depending on the position of the memory cell array is to provide at least two types of cell transistor with current driving capability different depending on the position of the memory cell array.

Changing the driving capability of the cell transistor depending on the position of the memory cell array enables solving performance degradation caused by the voltage drop resulting from the resistance component of the electric connection path from each driver to the memory cell array.

DETAILED DESCRIPTION

Exemplary embodiments of the present disclosure will be described below with reference to the drawings.

First Exemplary Embodiment

Figure 7:
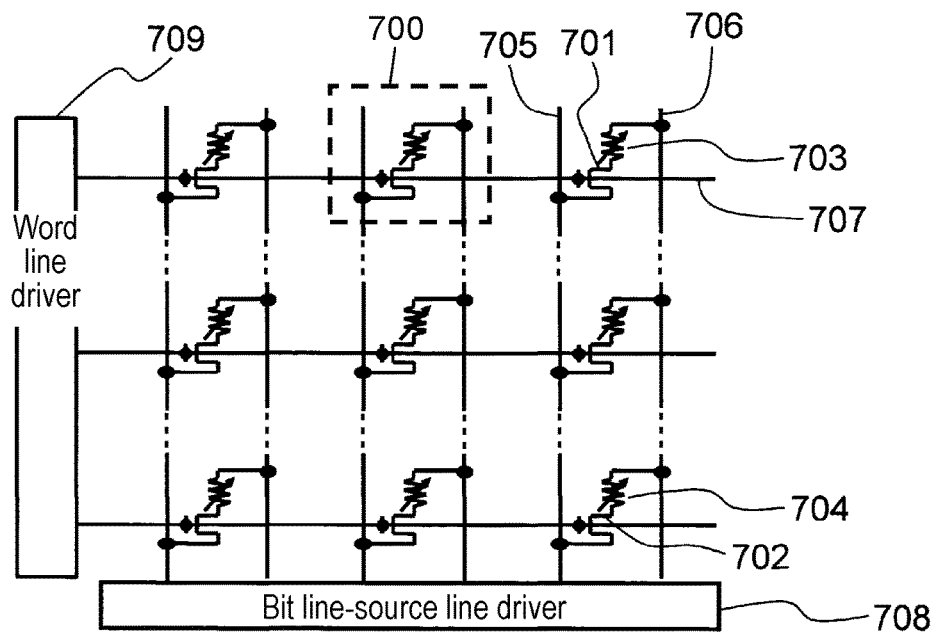
FIG. 7 is a structure diagram illustrating structure of a semiconductor memory (semiconductor storage device) according to a first exemplary embodiment of the present disclosure.

FIG. 7 is a structure diagram illustrating structure of a semiconductor memory (semiconductor storage device) according to a first exemplary embodiment of the present disclosure. With reference to FIG. 7, the preferred first exemplary embodiment of the present disclosure will be described. Designation illustrated in the diagram represents functional blocks and connecting lines. FIG. 7 illustrates connections of array structure of memory cells 700 each including a resistance change element and a cell transistor with drivers (driver circuits). The resistance change element (memory element) and the cell transistor of the memory cell with a long electric connection path from bit line-source line driver 708 are 703, 701, respectively. The resistance change element and the cell transistor of the memory cell with a short electric connection path from bit line-source line driver 708 are 704, 702, respectively.

A first terminal of a source and drain of each of cell transistors 701, 702 is connected to source line 705. A second terminal of the source and drain of cell transistor 701 is connected to resistance change element 703, whereas a second terminal of the source and drain of cell transistor 702 is connected to resistance change element 704. Resistance change elements 703, 704 are connected to bit line 706, and memory cells 700 in an identical column are connected to the common source line and the bit line. In addition, a gate terminal of cell transistor 701 is connected to word line 707, and memory cells 700 in an identical row are connected to the common word line.

Source line 705 and bit line 706 are connected to bit line-source line driver 708, which can supply electric power to each column independently.

Word line 707 is connected to word line driver 709, which can supply electric power to the word line of each row independently.

Cell transistor 702 of the memory cell with a short electric connection path from the bit line-source line driver includes a MOS transistor and has a gate width of W2. Cell transistor 701 of the memory cell with a long electric connection path from the bit line-source line driver has a gate width of W1. The gate width is set to satisfy W1>W2.

Generally, driving capability of a transistor increases as the gate width of a MOS transistor increases. Increasing the gate width according to a length of the electric connection path from each driver to the memory cell by using this property allows formation of a memory cell array including cell transistors having different current driving capability.

With the above structure, an operation of lowering resistance of resistance change element 101 will be described with reference to FIG. 8.

Figure 8:
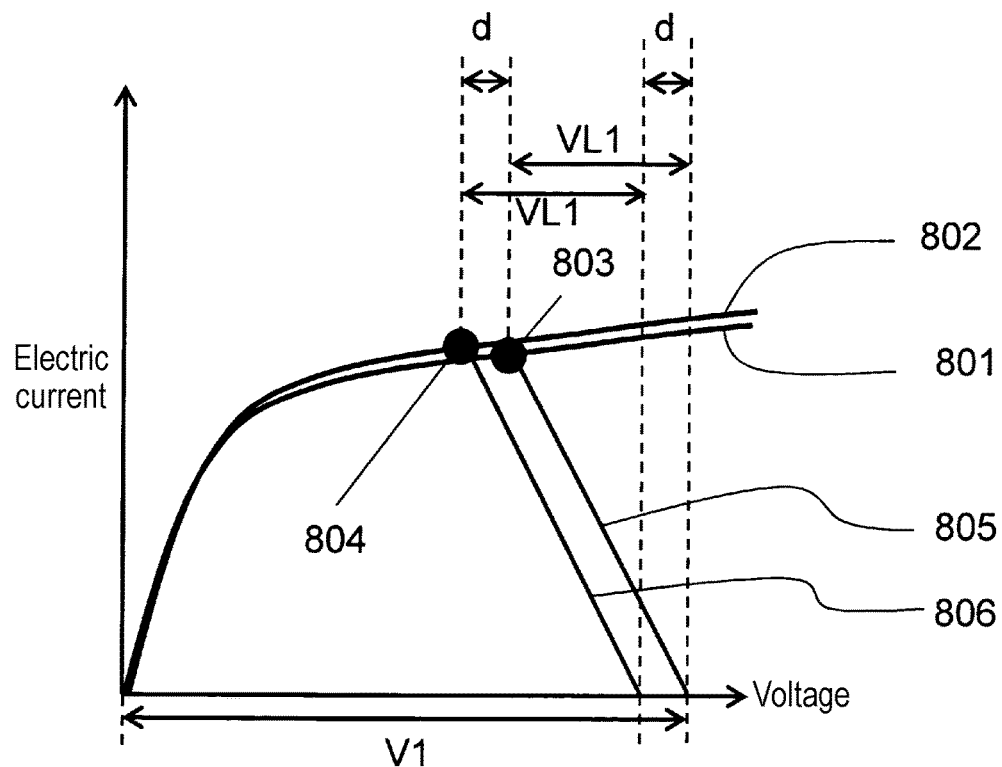
FIG. 8 is a graph illustrating the current that flows through the memory cell with a short electric connection path from each driver and the current that flows through the memory cell with a long electric connection path from each driver at the resistance lowering completion point according to the first exemplary embodiment of the present disclosure.

FIG. 8 illustrates a difference between the current that flows through the memory cell with a short electric connection path from each driver, and the current that flows through the memory cell with a long electric connection path from each driver at the resistance lowering completion point according to the first exemplary embodiment of the present disclosure. Line 801 illustrates a relationship between a source-drain potential difference and the current value that flows between the source and drain of cell transistor 702 of the memory cell with a short electric connection path from each driver. In line 801, the gate voltage is V1−VL1. Resistance lowering completion point 803 represents the source-drain potential difference and the current value that flows through the memory cell at the resistance lowering completion point. Reference numeral 805 is a straight line that connects the resistance lowering completion point and a point of voltage V1, current 0. An inclination of line 805 represents magnitude of resistance of resistance change element 704, and the resistance of resistance change element 704 is smaller as the inclination of line 805 is larger.

Reference numeral 802 represents the relationship between the source-drain potential difference and the current value that flows between the source and drain of cell transistor 701 of the memory cell far from each driver. Resistance lowering completion point 804 represents the source-drain potential difference and the current value that flows through the memory cell at the resistance lowering completion point.

Figure 1:
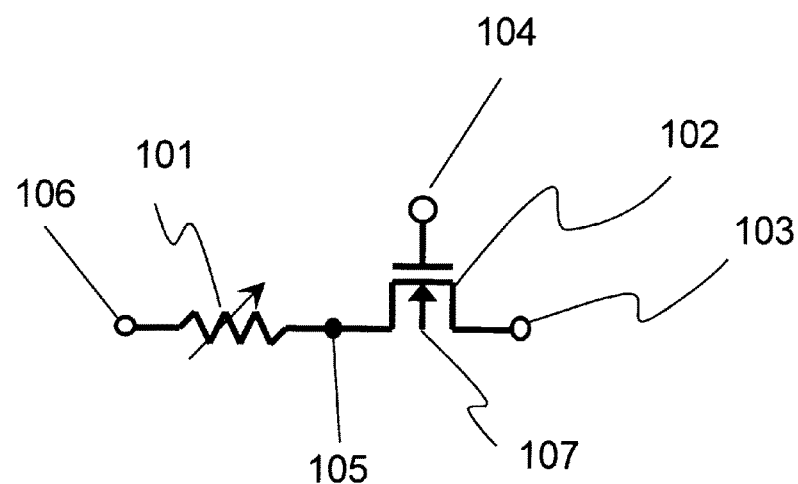
FIG. 1 is a circuit diagram of a memory cell using a resistance change element described in PTL 1.
Figure 2:
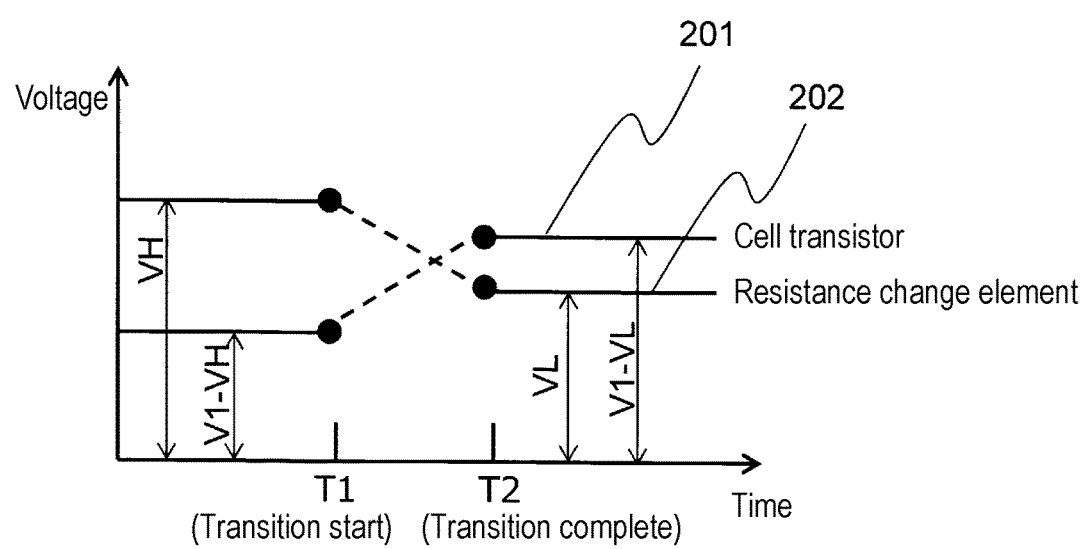
FIG. 2 is a diagram illustrating a change in a potential difference across the resistance change element and in a source-drain potential difference of a cell transistor over time, when the memory cell using the resistance change element described in PTL 1 transitions from a high resistance state to a low resistance state.
Figure 3:
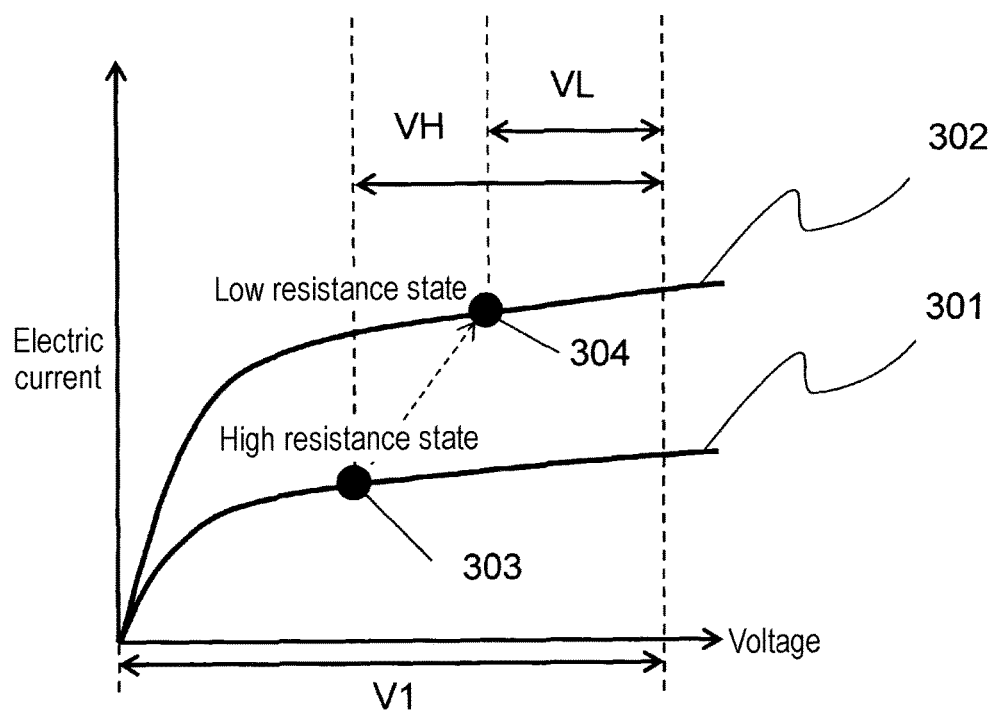
FIG. 3 is a diagram illustrating a relationship between a voltage and a current of the resistance change element and the cell transistor, when the memory cell using the resistance change element described in PTL 1 transitions from the high resistance state to the low resistance state.
Figure 4:
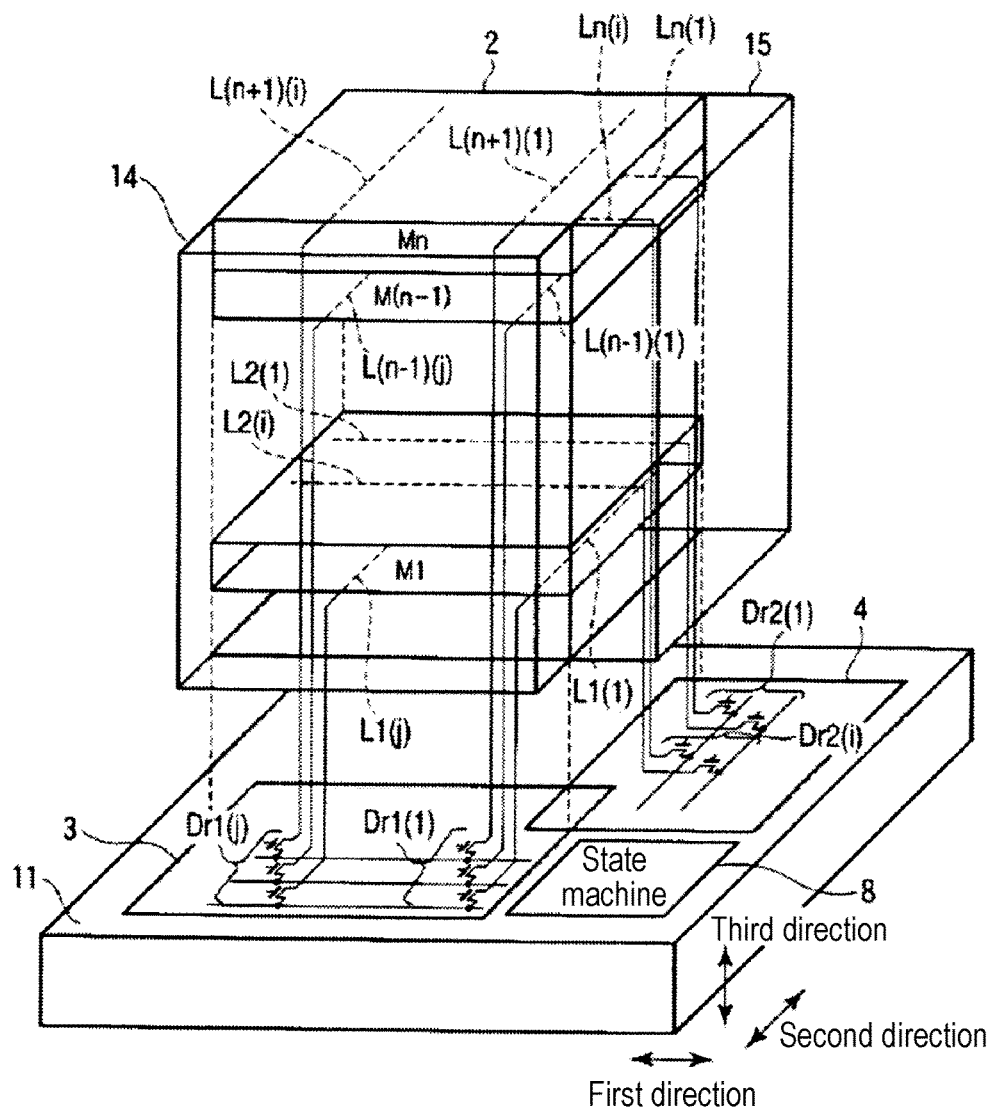
FIG. 4 is a structure diagram illustrating structure of a memory device by a conventional technology described in PTL 2.
Figure 5:
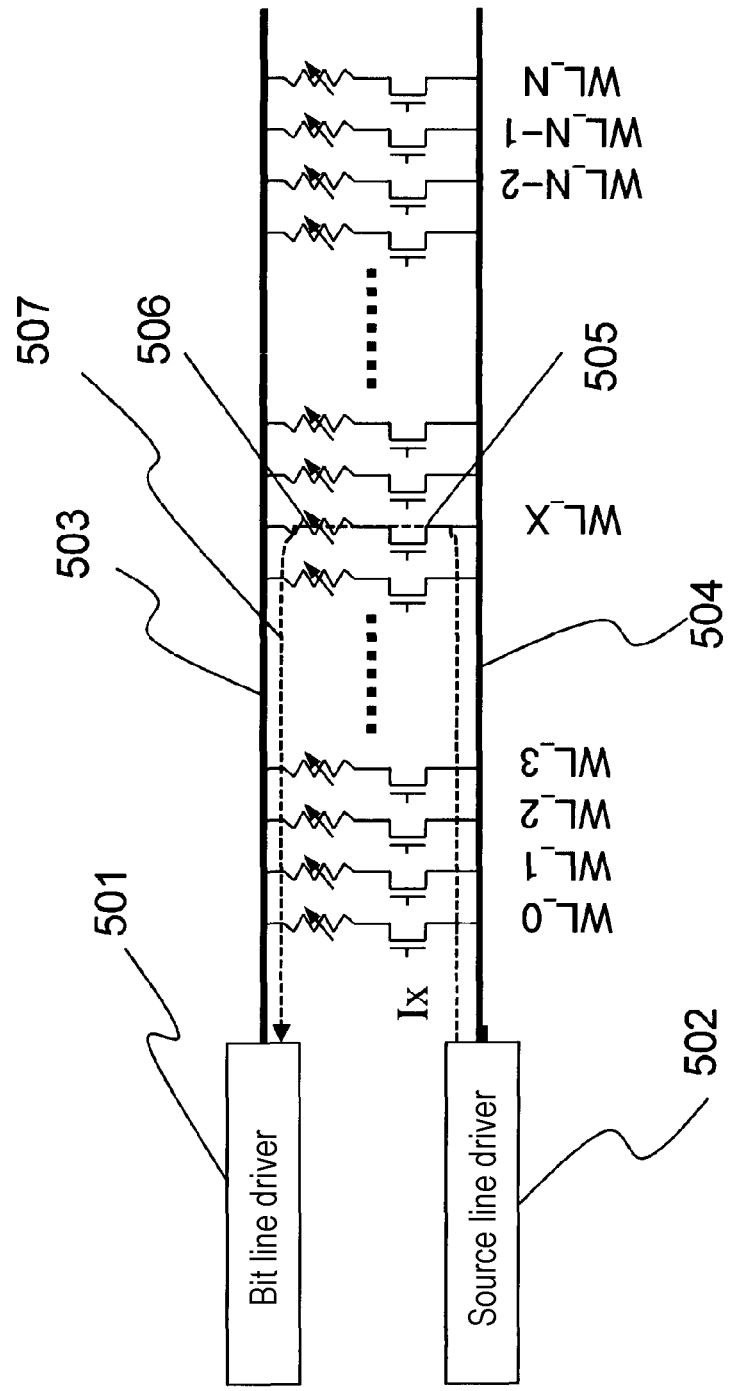
FIG. 5 is a structure diagram which cuts out part of a 1T1R type ReRAM memory cell array.
Figure 6:
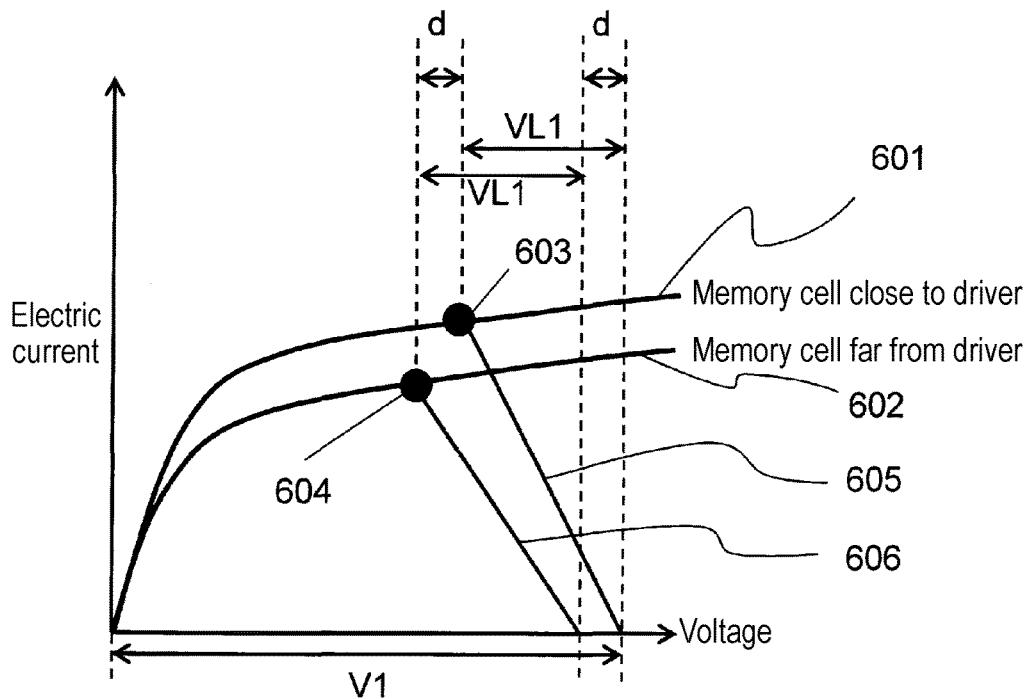
FIG. 6 is a diagram illustrating a difference in the current that flows through the memory cell with a short electric connection path from each driver and the memory cell with a long electric connection path from each driver at a resistance lowering completion point.

In conventional structure, as illustrated in line 602 of FIG. 6, when a voltage drop caused by a resistance component of source line 504 is d, the driving capability of the cell transistor becomes equivalent to the driving capability in a state where the gate voltage decreases by d. However, since the gate width of cell transistor 701 is longer than the gate width of cell transistor 702 according to the structure of the present disclosure, the driving capability of cell transistor 701 is equivalent to or larger than the driving capability of cell transistor 702. Consequently, line 802 indicates a characteristic that the current equivalent or larger than line 801 flows.

Attention is paid to the resistance of resistance change elements 703, 704 at the resistance lowering completion points. Reference numerals 805, 806 are each a straight line that connects the resistance lowering completion point and a point of a voltage on a bit line side of the resistance change element at the time and current 0. The inclinations of lines 805, 806 each represent magnitude of resistance of the resistance change element. When the memory cell is positioned far from each driver, the inclination of line 806 that represents the magnitude of the resistance is equivalent to the inclination of line 805 at the resistance lowering completion points, that is, represents that the resistance is equivalent.

Although the first exemplary embodiment describes the structure in which the gate width of the cell transistor is increased according to the length of the electric connection path from each driver, a similar effect can be obtained by changing the gate length. The short gate length in the MOS transistor can improve the driving capability of the transistor. This is the structure to shorten the gate length of the memory cell with a long electric connection path from each driver in the memory cell array.

In addition, it is also possible to change the driving capability of the transistor by changing an amount of ion implantation into the memory cell or a film thickness of a high resistance layer.

Second Exemplary Embodiment

Figure 9:
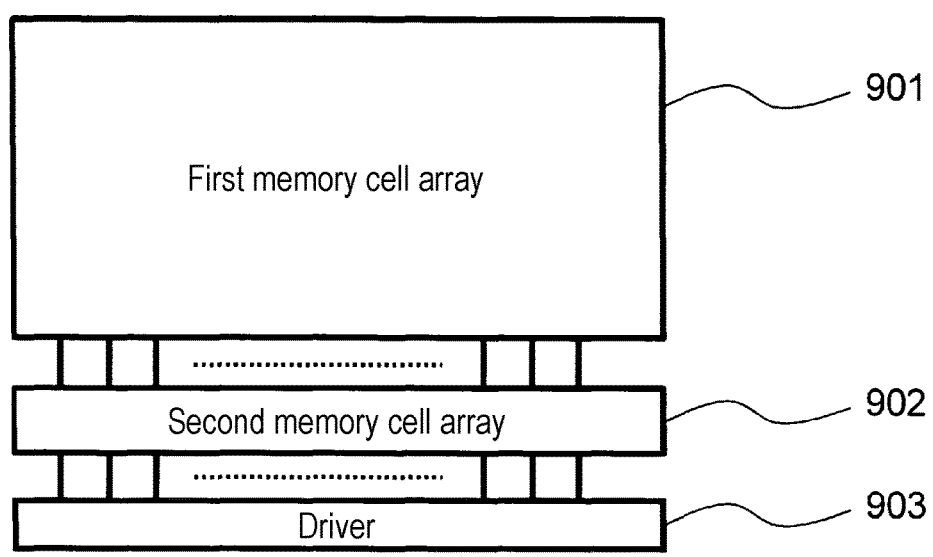
FIG. 9 is a structure diagram illustrating structure according to a second exemplary embodiment of the present disclosure.

With reference to FIG. 9, a preferred second exemplary embodiment of the present disclosure will be described. Designation illustrated in the diagram represents functional blocks and connecting lines.

In FIG. 9, a memory cell array is divided into first memory cell array 901 and second memory cell array 902, and each memory cell array is driven by driver 903. The memory cell array is configured such that, when a gate width of cell transistors used in first memory cell array 901 is W1 and a gate width of cell transistors used in second memory cell array 902 is W2, W1≠W2.

For example, reducing W1 leads to a small current and deterioration in rewriting characteristics, but to a small cell size and increase in degree of integration. Increasing W1 leads to the large electric current and improvement in the rewriting characteristics, but to the large cell size and decrease in the degree of integration. A region of first memory cell array 901 and a region of second memory cell array 902 are divided and intermingled with wide W1 in a section where high reliability is required and narrow W1 in a section where high reliability is not required.

In a semiconductor storage device according to the present disclosure, the memory cell array is divided into a plurality of regions, and current driving capability of cell transistors may differ from region to region.

This allows the semiconductor storage device to have structure adapted to application of the memory.

Changing the gate width of the cell transistor of each of first memory cell array 901 and second memory cell array 902 results in that a current value after the lowering of resistance changes depending on each memory cell array. By this change, a best condition is selected for tolerance to a number of times of rewriting, and the memory cell array that fits this condition is used for applications with the large number of times of rewriting. In addition, the memory cell array using a condition in which the gate width is best for data holding characteristics is used for long-term data storage applications. A relationship between the gate width and memory performance, such as the tolerance to the number of times of rewriting and the data holding characteristic, of the cell transistor is optimized for each purpose. In this case, the gate width of the memory cell array far from driver 903 is not necessarily larger. In addition, different gate width may be intermingled within the memory cell array, and the gate width may be changed in each memory cell array.

The semiconductor storage device according to the present disclosure may have at least two types of cell transistors with the current driving capability different according to the position of the memory cell array.

Instead of the cell array adapted to the application of the memory in the semiconductor storage device according to the second exemplary embodiment, the semiconductor storage device according to the first exemplary embodiment of the present disclosure may have at least two types of cell transistors according to the position in the memory cell array.

Moreover, there may be at least two types of semiconductor storage devices according to the first exemplary embodiment of the present disclosure according to the position of the memory cell array and the position of the cell transistor in the memory cell array.

The nonvolatile semiconductor storage device according to the present disclosure can make the rewriting current almost identical even if supply voltage from the driver decreases by the electric connection path from each driver to the memory cell array, can flatten memory operations regardless of the position of the memory cell array, and thus is useful for memory (storage device).

What is claimed is:

1. A semiconductor storage device comprising:
a memory cell array; and
a driver circuit that drives the memory cell array, the driver circuit being connected to the memory cell array,
the memory cell array comprising memory cells,
each of the memory cells comprising:
   a memory element; and
   a cell transistor, one of a source and a drain of the cell transistor being electrically connected to the memory element, wherein:
cell transistors of the memory cells include at least two types of cell transistors with different current driving capability according to a position in the memory cell array,
the cell transistor of each of the memory cells having a long electric connection path from the driver circuit has larger current driving capability than the cell transistor of each of the memory cells having a short electric connection path from the driver circuit,
a terminal of each of cell transistor is connected to a source line,
the other terminal of each of cell transistor is connected to a bit line,
the driver circuit is connected to an end of the source line and an end of the bit line, drives current from the source line to the drive circuit through the bit line, and is arranged integrally, and
the source line and the bit line in the memory cell array are extended in the same direction.

2. The semiconductor storage device according to claim 1, wherein the memory element is a resistance change element.

3. The semiconductor storage device according to claim 1, wherein:
the memory cell array is divided into a plurality of regions, and
the current driving capability of the cell transistor in each of the plurality of regions is different.

4. The semiconductor storage device according to claim 1, wherein the at least two types of cell transistors have gate widths different from each other.

5. The semiconductor storage device according to claim 1, wherein the at least two types of cell transistors have gate lengths different from each other.

6. The semiconductor storage device according to claim 1, wherein the driver circuit is provided commonly to the memory cells.

* * * * *